(12) United States Patent
Micheloni et al.

(10) Patent No.: US 7,394,694 B2
(45) Date of Patent: Jul. 1, 2008

(54) FLASH MEMORY DEVICE WITH NAND ARCHITECTURE WITH REDUCED CAPACITIVE COUPLING EFFECT

(75) Inventors: Rino Micheloni, Turate (IT); Roberto Ravasio, Ponte San Pietro (IT); Ilaria Motta, Cassolnovo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 207 days.

(21) Appl. No.: 11/445,491

(22) Filed: May 31, 2006

(65) Prior Publication Data
US 2006/0285387 A1    Dec. 21, 2006

(30) Foreign Application Priority Data
Jun. 1, 2005    (EP) ................... 05104742

(51) Int. Cl.
*G11C 11/34* (2006.01)
(52) U.S. Cl. .............................. 365/185.17; 365/185.18
(58) Field of Classification Search ............ 365/185.17, 365/185.18, 185.29
See application file for complete search history.

(56) References Cited
U.S. PATENT DOCUMENTS

| | | | |
|---|---|---|---|
| 5,473,563 A * | 12/1995 | Suh et al. ................. | 365/185.13 |
| 5,511,022 A | 4/1996 | Yim et al. | |
| 6,044,017 A * | 3/2000 | Lee et al. ................ | 365/185.18 |
| 6,567,316 B1 | 5/2003 | Ohba et al. | |
| 6,661,711 B2 | 12/2003 | Pan et al. | |
| 7,310,272 B1 * | 12/2007 | Mokhlesi et al. ........ | 365/185.22 |
| 2002/0110019 A1 | 8/2002 | Satoh et al. | |
| 2006/0274578 A1 * | 12/2006 | Kwak et al. ............ | 365/185.17 |

OTHER PUBLICATIONS

Seungjae Lee et al., "A 3.3V 4Gb Four-Level NAND Flash memory with 90nm CMOS Technology," 2004 IEEE International Solid-State Circuits Conference, Session 2, Non-Volatile Memory, 2.7.

* cited by examiner

*Primary Examiner*—Anh Phung
(74) *Attorney, Agent, or Firm*—Lisa K. Jorgenson; Robert Iannucci; Seed IP Law Group PLLC

(57) ABSTRACT

A NAND flash memory device includes a matrix of memory cells each having a threshold voltage. The matrix includes an individually erasable sector and is arranged in plural rows and columns with the cells of each column arranged in plural strings of cells connected in series. The memory device includes logic that erases the cells of a selected sector, and restoring logic that restores the threshold voltage of the erased cells. The restoring logic acts in succession on each of plural blocks of the sector, each block including groups of one or more cells. The restoring logic reads each group with respect to a limit value exceeding a reading reference value, programs only each group wherein the threshold voltage of at least one cell does not reach the limit value, and stops the restoring in response to reaching the limit value by at least one set of the groups.

25 Claims, 8 Drawing Sheets

FLASH MEMORY DEVICE WITH NAND ARCHITECTURE WITH REDUCED CAPACITIVE COUPLING EFFECT

BACKGROUND OF THE INVENTION

1. Field of the Invention

The present invention relates to the non-volatile memory field. More specifically, the present invention relates to the erasing of a flash memory device With NAND architecture.

2. Description of the Related Art

The flash memory devices are non-volatile memories wherein each single cell may be programmed electrically, but a large number of cells, forming a sector, are erased at the same time. Typically, the cells consist of floating gate MOS transistors which store a logic value defined by their threshold voltage (which depends on the electric charge stored on the floating gate). Particularly, in a flash memory with NAND architecture, the cells are grouped in strings, each one consisting of a set of cells that are connected in series. The main advantage of such architecture is the reduced area occupation, essentially due to both the reduction of the contacts number and the reduced size of each cell. This makes the NAND memories particularly advantageous in a number of applications such as memory cards, memories of digital video-cameras and of audio recorders.

In order to maintain reduced sizes, the NAND memories implement a decoding system that is able to apply positive voltages only (i.e., greater or equal to zero) to the various cells selectively. Moreover, the cells are generally erased by applying a single blind erasing pulse (which reduces the threshold voltages of the cells below a reference reading voltage).

A problem of the NAND memories is due to the capacitive coupling between the floating gates of adjacent cells; such effect makes the threshold voltage of a cell dependent non-uniquely on the electric charge stored in its floating gate but even on the electric charges stored in the floating gates of the adjacent cells. The problem is particularly acute in the NAND memories because of their high integration. Such effect modifies the threshold voltages of the cells whenever the adjacent cells are programmed. The suffered variation increases with the amplitude of the gap of the threshold voltages of the adjacent cells (for example, for a gap of 2.5V the variation of the threshold voltage is equal to about 130 mV, while for a gap of 7V the variation of the threshold voltage is equal to about 360 mV). Thus, the problem is particularly acute when the adjacent cells that are programmed start from a very low original threshold voltage. Such effect is emphasized by the single pulse erasing procedure; in fact, the erasing pulse has to be dimensioned in order to guarantee the erasing in the worst conditions, so that it normally brings the threshold voltages of the erased cells to very low values. The above described variation of the threshold voltages can cause reading errors. Such effect is experienced in the standard NAND memories but it is more and more limiting in the multi-level NAND memories wherein each cell stores multiple bits (since the margins which are used for discriminating the different stored logic values are reduced).

In order to limit the capacitive coupling effect, a sequential programming method of the pages into which the memory is logically divided is often adopted; in such case, the pages have to be programmed in succession according to their physical order. This operative way removes the capacitive coupling effect due to the preceding pages. In fact, the preceding pages cannot change the threshold voltages of the cells of the current page because they are not modified any longer after their programming. However, such technique does not remove the capacitive coupling effects of the other cells which are programmed successively.

The patent U.S. Pat. No. 6,661,711 B2 discloses a method for shifting the distribution of the threshold voltages of the erased cells. In such case, the cells are programmed until their threshold voltage does not exceed a predetermined value. Such operation is indiscriminately performed over all the cells, with the exception of some cells (in the example at issue, eight), which the threshold voltage exceeds an acceptable maximum value. In such a way, a shifting of the distribution of the threshold voltages is obtained. Nevertheless, the proposed solution substantially maintains the same shape of the distribution, which generally has a rather long tail due to the cells having a threshold voltage more negative.

BRIEF SUMMARY OF THE INVENTION

One embodiment of the present invention proposes a solution that is based on the idea of compacting the distribution of the threshold voltages of the erased cells.

One embodiment of the present invention proposes a flash memory device with NAND architecture. The memory devices include a matrix of memory cells (each one having a programmable threshold voltage). The matrix includes one or more sectors which are individually erasable. The matrix is arranged in a plurality of rows and columns. The cells of each row are connected to a corresponding word line and the cells of each column are arranged in a plurality of strings of cells connected in series; the strings of each column are connected to a corresponding bit line. The memory device further includes means for erasing the cells of a selected sector; means is further provided for restoring the threshold voltage of the erased cells. The means for restoring act in succession on each of a plurality of blocks of the sector; the block includes, for each one of a set (one or more) of selected bit lines, a group of cells connected to a set (one or more) of selected word lines. The means for restoring includes means for reading each group with respect to a limit value (for example, −3V) exceeding a reading reference value (for example, 0V). Means is further provided for programming only each group wherein the threshold voltage of at least one cell of the group does not reach said limit value. Further means is used for stopping the restoring in response to the reaching of the limit value by at least one sub-set of the groups.

In a preferred embodiment of the invention, the reading is performed by applying a negative voltage to a common body region of the cells of the sector (so as to obtain a rising of their apparent threshold voltage equal to the limit value).

In a specific implementation, the reading is performed at the single cell level (with the restoring that is stopped in response to the reaching of the limit value by all the cells of the block).

Alternatively, the same operation is performed at the string level (with the restoring that is stopped in response to the reaching of the limit value by a predetermined number of strings, for example, only one).

Advantageously, the cells of the sector are programmed before the erasing.

A still further embodiment of the present invention proposes erasing the cells of the sector in a controlled way.

As a further improvement, the cells are verified after the restoring (and a reduced erasing pulse is applied when it is necessary).

In a preferred embodiment of the invention, the verify of the erasing is performed by applying a negative voltage to the body region as well (so as to obtain a rising of the threshold voltage of the cells equal to a reference reading value with a margin).

A way to improve the solution is by enabling the means for restoring in succession with two or more limit values (closer and closer to the reading reference value).

A further embodiment of the present invention proposes a corresponding erasing method.

BRIEF DESCRIPTION OF THE SEVERAL VIEWS OF THE DRAWING(S)

The invention itself as well as further features and the advantages thereof will be best understood by reference to the following detailed description, given purely by way of a non-restrictive indication, to be read in conjunction with the accompanying drawings. In this respect, it is expressly intended that such figures are not necessarily in scale and that, unless otherwise indicated, they are intended simply to disclose the described structures and procedures conceptually. In particular:

Figure 4A:
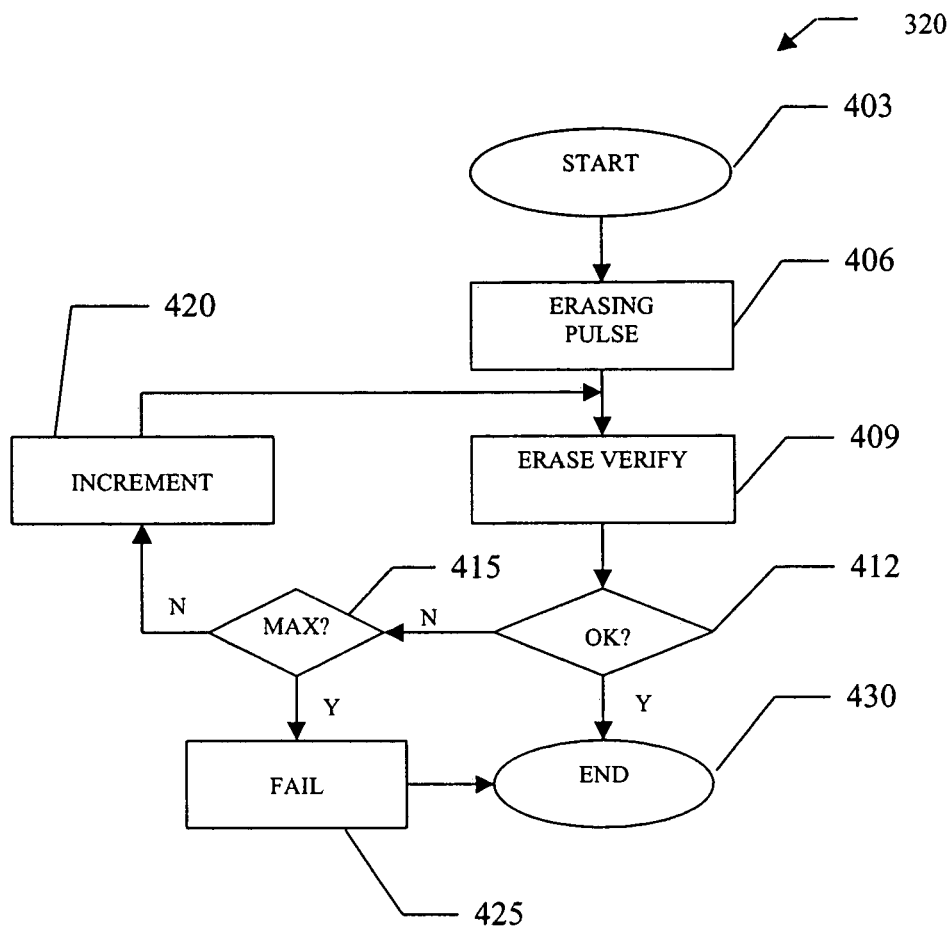
Figure 4B:
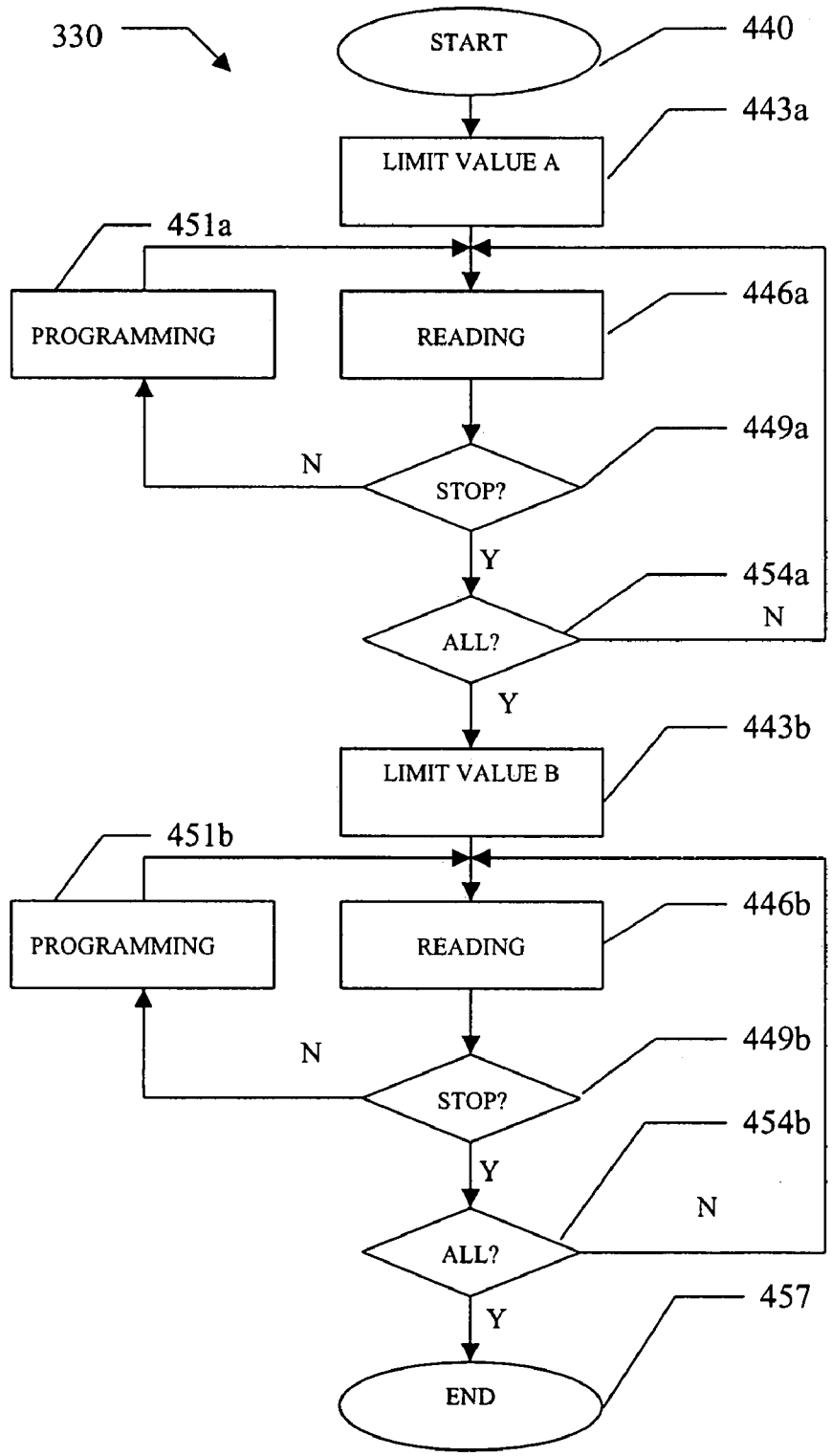
Figure 4C:
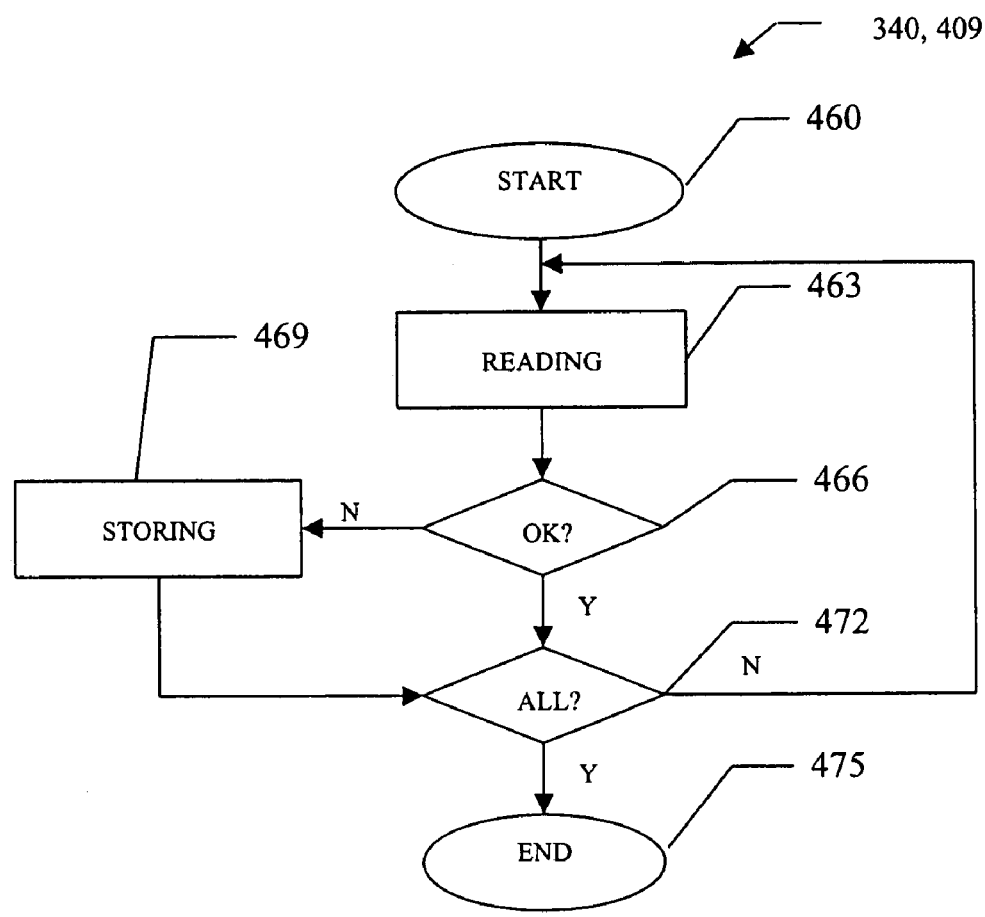

FIGS. 4a-4c detail several phases of the erasing procedure;

FIGS. 5a-5d are an exemplary representation of several distributions of the threshold voltage of the erased cells.

DETAILED DESCRIPTION OF THE INVENTION

Figure 1:
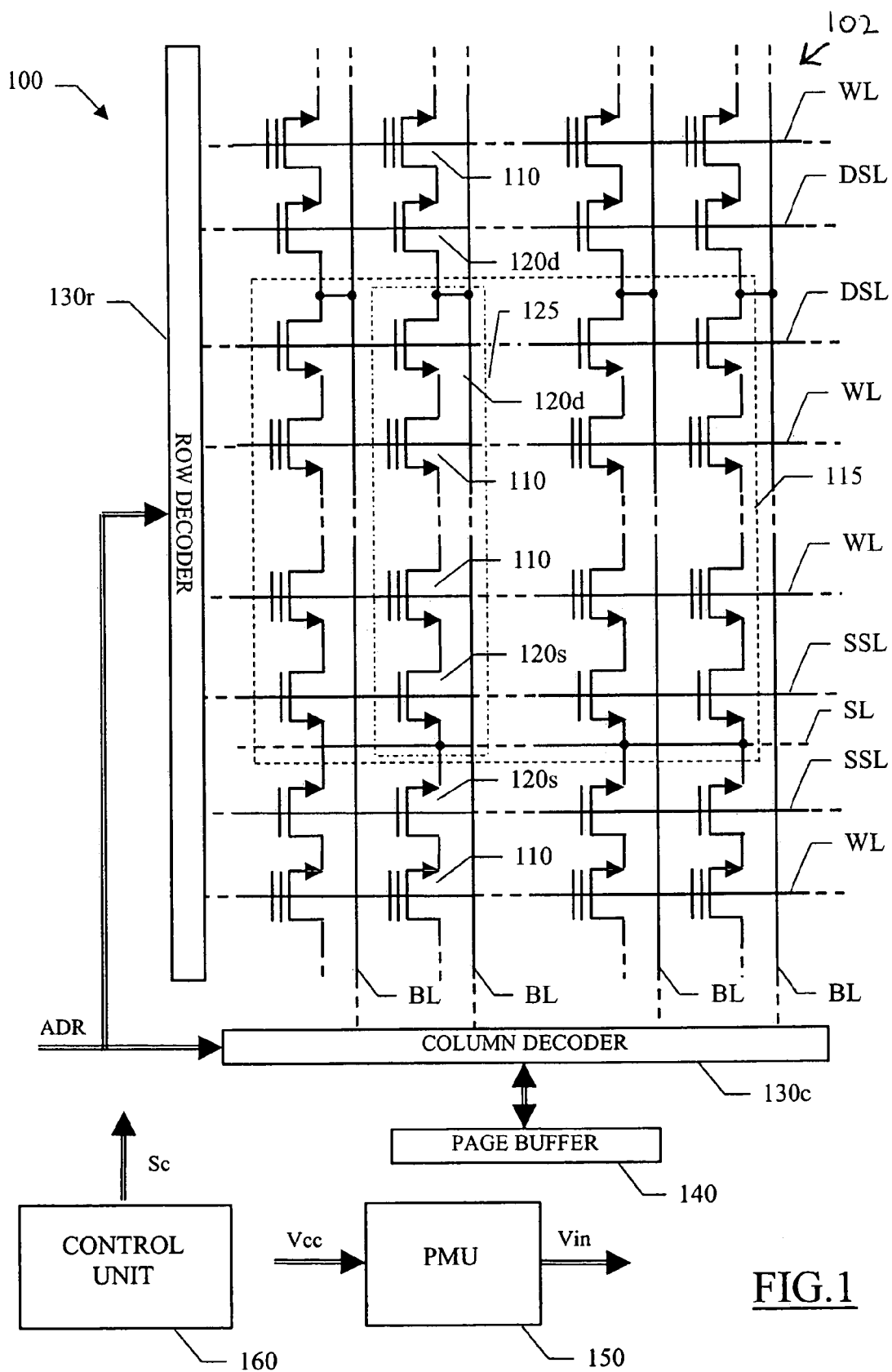
FIG. 1 shows a basic block diagram of a memory device in which the solution according to an embodiment of the present invention can be used.

With reference in particular to FIG. 1, a non-volatile semiconductor memory device of the flash type 100 is shown. The memory device 100 includes a matrix 102 of cells 110, typically realized by floating-gate MOS transistors; the matrix 102 includes one or more sectors 115, each one being erasable individually.

In an erased condition each cell 110 has a low threshold voltage (to which a logic level 1 is typically associated). The cell 110 is programmed by injecting electrons into its floating-gate; in this condition the cell 110 has a high threshold voltage (to which a logic level 0 is typically associated). Therefore, when the cell 110 is biased for reading, it is conductive if erased or it is non-conductive if programmed.

The cells 110 are arranged in a plurality of rows and columns. The memory device 100 has NAND type architecture. In this configuration, each sector 115 includes a plurality of strings 125 that are connected in parallel; each string 125 is formed by a set of cells 110 (typically 16) that are connected in series between two select transistors 120s and 120d. In detail, an intermediate cell 110 of the string 125 has a drain terminal connected to the source terminal of an upper cell 110 and a source terminal connected to the drain terminal of a lower cell 110. The first cell (lowest) 110 of the string 125 has a source terminal connected to the drain terminal of the select transistor 120s, while the last (uppermost) cell 110 of the string 125 has a drain terminal connected to the source terminal of the select transistor 120d. Moreover, the select transistor 120s has a source terminal connected to the source terminal of the select transistor 120s of a lower string and the transistor 120d has a drain terminal connected to the drain terminal of the select transistor 120d of an upper string. The gate terminals of the cells 110 of each row are connected to a corresponding word line WL. The drain terminals of the select transistors 120d of the strings of each column are connected to a corresponding bit line BL. The gate terminals of the select transistors 120d positioned on a same row are connected to a corresponding drain select line DSL; likewise, the gate terminals of the select transistors 120s positioned on a same row are connected to a corresponding source select line SSL. Moreover, the source terminals of all the select transistors 120s are connected to a common source line SL, which is typically maintained at a reference voltage (or ground).

The cells 110 belonging to each row are logically grouped in two pages; in detail, a first page is formed by the cells 110 having an even position and a second page is formed by the cells 110 having an odd position. The memory device 100 receives an address ADR for selecting the desired page. A portion of the address ADR is supplied to a row decoder 130r that selects the word line WL of the desired page, and the drain select line DSL and the source select line SSL of the corresponding strings. Another portion of the address ADR is supplied to a column decoder 130c; the column decoder 130c connects the bit lines BL of the desired page, that is, the even ones or the odd ones, to a page buffer 140 (which is used for reading and for writing the cells 110 of the selected page).

The memory device 100 further includes a power management unit (PMU) 150 and a control unit 160. The PMU 150 supplies the voltages that are used for performing the various operations on the memory device 100, for example, from −20V to 20V (referred to as a whole with Vin); the voltages Vin are generated (for example, through charge pumps) starting from a power supply voltage Vcc supplied from the outside (typically, 3.3 or 5V). The control unit 160 provides the control signals (referred to as a whole with Sc) that are used for driving the various components of the memory device 100.

Figure 2:
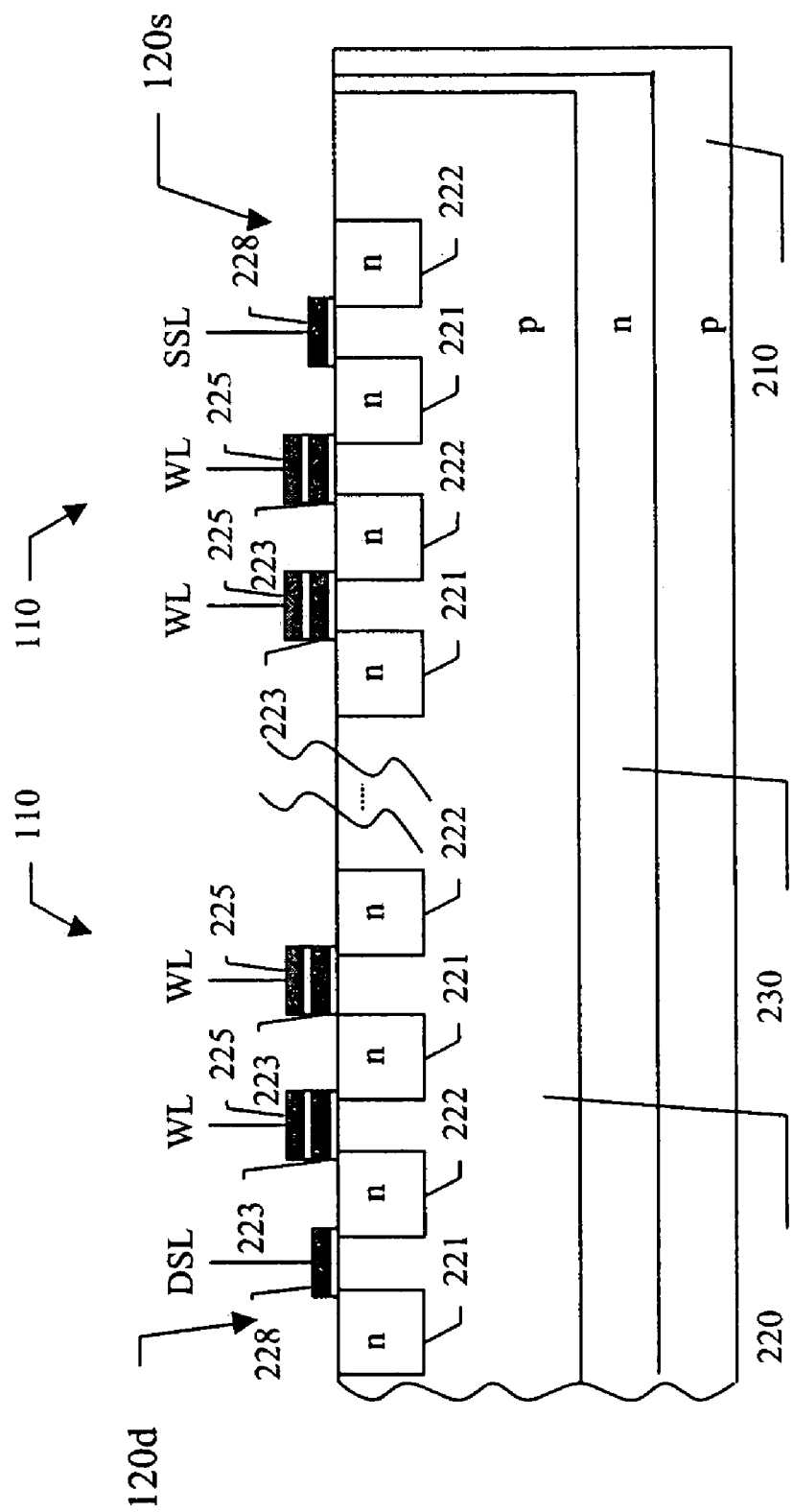
FIG. 2 shows a partial cross-section view of a string of cells of the memory device.

Moving now to FIG. 2, the memory device is integrated into a chip 210 of p-type semiconductor material. The cells 100 are formed in a triple-well structure. In particular, the cells 110 are formed in a p-type body region 220, inside an n-type well 230 formed into the chip 210 (of p-type). This allows applying negative voltages to the body region 220 without problems of insulation from the rest of the chip 210.

Each cell 110 is formed by an n-type drain diffusion 221 and by a n-type source diffusion 222, both realized in the body region 220 (of p-type). A floating gate 223 and a control gate 225 are stacked over a channel formed between the drain diffusion 221 and the source diffusion 222. The floating gate 223 is not accessible from the outside whereas the control gate 225 is connected to the corresponding word line WL. The select transistors 120s and 120d are likewise formed by a drain diffusion 221 and by a source diffusion 222. A control gate 228 is insulated from the channel (between the diffusions 221 and 222) by means of an oxide layer. The control gates 228 of the select transistors 120s and 120d are connected to the corresponding select source line SSL and to the corresponding drain select line DSL, respectively. As shown in the figure, the drain diffusion 221 and the source diffusion 222 of each cell 110 or select transistor 120s, 120d are in common with the source diffusion 222 and the drain diffusion 221 of an adjacent element 110, 120s, 120d, respectively.

Figure 3:
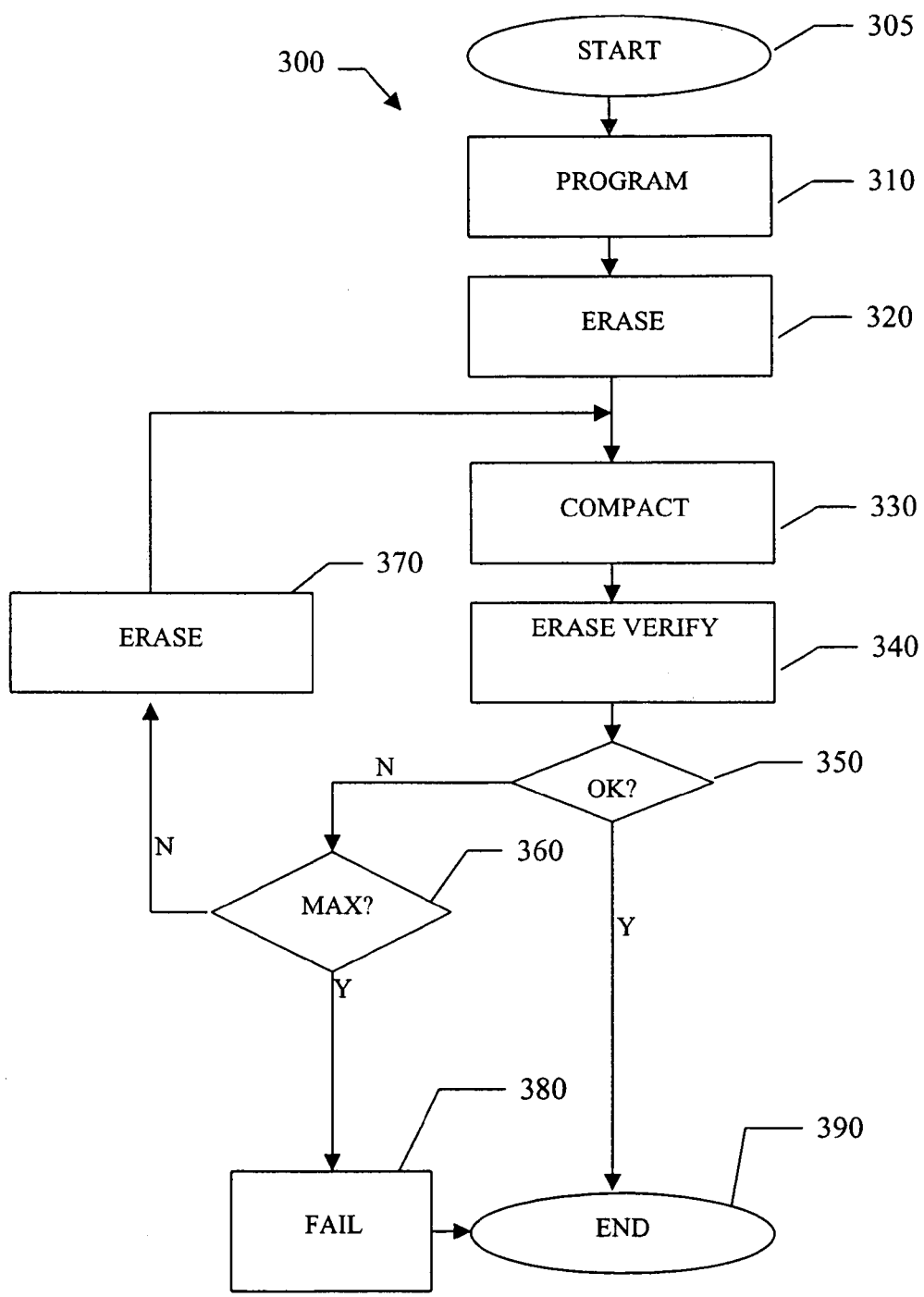
FIG. 3 shows a flow-chart disclosing an erasing procedure of the memory device according to an embodiment of the present invention.

With reference to FIG. 3, there is shown a method 300 disclosing an erasing algorithm of a selected sector according to an embodiment of the present invention. The method 300 starts at the block 305 and then moves to the block 310, wherein all the cells of the sector are programmed (in order to guarantee a uniform ageing thereof). In this phase the select lines of all the strings are brought to a high voltage value (for example, Vcc) in order to switch on the relative select transistors; moreover, all the bit lines are brought to the voltage 0V, and a blind programming pulse is applied to all the word lines (for example, with a value 10V-12V and a length of 10 μs-80 μs).

The block 310 is followed by the block 320, wherein all the cells of the sector are erased (as described in detail in the following with reference to FIG. 4a). In such a way, the threshold voltage of each cell of the sector is brought under a reading reference value of the logic value 1 (typically, 0V). Then, the method provides for a loop which starts at the block 330, wherein the distribution of the threshold voltages of the erased cells is compacted over a predetermined limit value (for example, −3V); such compacting phase is described in detail in the following with reference to FIG. 4b. Thus, the method verifies at the block 340 whether all the cells of the sector are still erased (i.e., their threshold voltage is lower than the reference value 0V); the erase verify phase is described in detail in the following with reference to FIG. 4c. In the negative case, a test is performed at the block 360 for determining whether the number of iterations of the loop has reached an acceptable maximum value (for example, 5-10). If such condition is not verified, the activity flow moves to the block 370, wherein a reduced erasing pulse is applied to the cells of the sector (for example, of value 2V-3V and with a length of 100 μs-200 μs), so as to correct possible errors due to an excessive programming. Then, the method returns to the block 330 for reiterating the above described operations. The loop ends when the verify phase has a positive result (block 350) or after such maximum number of attempts (block 360); in this latest case the sector is set as failed at the block 380. In both cases the method thus ends at the block 390.

As previously indicated, FIG. 4a details a possible implementation of the erasing phase which is performed at the block 320. The method starts at the block 403 and then moves to the block 406, wherein a single blind erasing pulse is applied to the cells of the sector. In particular, the select lines are brought to the voltage Vcc and the bit lines are brought to the voltage 0V; moreover, a voltage pulse is applied to the body region, for example, with a ramp pattern that starting from 0V reaches 19V in 800 μs, and then remains steady for a period typically equal to 200 μs. Then, the method verifies at the block 409 whether the sector is completely erased (as described in detail in the following with reference to FIG. 4c). In the negative case (block 412) a test is performed at the block 415 for determining whether the number of iterations of the loop has reached an acceptable maximum value (for example, 5-10). If such condition is not verified, the activity flow moves to the block 420, wherein the amplitude of the voltage pulse to be applied to the body region is increased (for example, by 50 mV); the corresponding increased erasing pulse is applied to the cells of the sector for a short time period (for example, 40 μs). Then the method returns to the block 409 for repeating the same operations. The above described loop ends when the verify phase has a positive result (block 412) or after such maximum number of attempts (block 415); in this latest case, the sector is set as failed at the block 425. In both cases the method thus ends at the block 430. In such a way, there is obtained a controlled erasing of the sector that strongly reduces the cells having a very low threshold voltage.

With reference to FIG. 4b, a preferred implementation of the compacting phase (block 330) realizes a method that starts at the block 440. The block 443a follows the block 440 wherein there is set a first limit value VLa (for example, −3.5V), which is slightly lower then the desired value (i.e., −3V in the example at issue); such limit value VLa is used for performing a coarse compacting of the distribution of the threshold voltages of the erased cells. Thus, a first loop is executed starting at the block 446a, wherein a selected block of the cells of the sector (starting from the first one) is read with respect to the limit value VLa.

The block is determined by the bit lines of a desired page; for each bit line the block includes a group of cells connected to one or more selected word lines. In particular, each group is formed by a single cell (performing a page level reading) or by an entire string (performing a string level reading).

In the first case, (page level reading) the select lines of the strings corresponding to the selected page are brought to the voltage Vcc. The word line of the selected page is brought to the voltage 0V whereas the other word lines of the corresponding strings are brought to a voltage Vpass (for example, 20 V) so that the respective cells are always conductive (irrespective of their threshold voltage). A (negative) voltage is applied to the body region, in order to produce an increasing equal to the value VLa of the apparent threshold voltage of the cells due to the body effect. Thus, by using the conventional reference reading value (0V), each cell of the selected page will be conductive if its (real) threshold voltage is lower then the limit value VLa and not conductive otherwise; this allows discriminating such cells on the basis of the read logic value (1 or 0, respectively). It should be noted that in such way the negative voltage (used for reading the cells with respect to the limit value VLa) is applied to the body region of the whole sector, so that it is not necessary any decoding of negative voltages (for driving the selected word lines). This allows continuing on using a decoding system for positive (or null) voltages only, with a reduced area occupation on the semiconductor material chip.

In the case of string level reading, the select lines of the selected strings are likewise brought to the voltage Vcc; however, all the word lines of the selected strings are now brought to the voltage 0V whereas the body region is brought to the negative voltage used for reading the cells with respect to the limit value VLa (by using a conventional reference reading value 0V). In such a way, for each bit line there is read the logic value 1 if the threshold voltage of all the cells of the corresponding string is lower than the limit value VLa (i.e., the cells are conductive) or the logic value 0 if the threshold voltage of at least one cell of the string is greater than the limit value VLa (i.e., such cell is not conductive).

Thus, the method verifies at the block 449a if the reading has a negative result, i.e., there is at least one group (cell or string) which has provided a logic value 1 (since the cell or all the cells of the string have a threshold voltage lower than the limit value VLa, respectively). In such case, the flow of activity moves to the block 451a, wherein a programming pulse is applied to the groups of cells (single cell or string) which do not satisfy the above-mentioned condition. In particular, the body region and the corresponding select and bit lines are brought to the voltage 0V. Thus, a voltage pulse is applied to the desired word lines; for example, such pulse has a length typically equal to a ten of μs and an initial value of 6V which is incremented by a predetermined amount (typically, 50 mV) during each iteration of the operation on the same block. Thus, the method returns to the block 446a for repeating the above described operations.

As soon as the reading of all the cells of the block (in the case of page level reading) or the reading of a predetermined number of strings of the block, for example one (in the case of string level reading) provides the logic value 0 (block 449a), the method exits the above described loop and it moves to the block 454a. During such phase there is verified whether all the blocks of the sector have been compacted. In the negative case, the flow of activity returns to the block 446a for repeating the same operations on a next block.

As soon as all the cells of the sector have been compacted, the method moves to the block 443b wherein a second limit value VLb equal to the actual desired value (i.e., −3V in the example at issue) is chosen. Thus, the method proceeds with a further compacting at the blocks 446b-454b having operative modes analogous to the preceding one (blocks 446a-454a). In such a way a fine compacting of the distribution of the threshold voltages of the erased cells is performed. It should be noted that in such case the variation of the threshold voltages has a small value (thanks to the preceding coarse compacting); thus, the capacitive coupling effect on the already compacted cells by the subsequent programming operations can be considered negligible.

As soon as all the cells of the sector have been compacted (block 454b), the method ends to the block 457.

The FIG. 4c details a possible implementation of the erase verify phase (block 340 in FIG. 3 and block 409 in FIG. 4a). The method starts at the block 460 and performs a loop that starts at the block 463; in such phase each block of the sector (starting from the first one) is read with respect to a reference value with a margin (for example, −1V). Such operation can be performed either at the page level or at the string level, with a procedure in the whole similar to one described above with reference to the compacting phase; the only difference is that in such case a negative voltage is applied to the body region so as to produce an increment of the apparent threshold voltage of the cells equal to the reference value with a margin. Thus (by using the conventional reference reading value 0V), for each bit line the logic value 0 is read if the corresponding cell has a threshold voltage greater than the reference value with a margin (page level reading) or if such condition occurs in at least one cell of the corresponding string (string level reading). Thus, the method verifies at the block 466 if the reading has a negative result, i.e., there is at least one group (cell or string) that has provided a logic value 0. In such case the address of each group that has not passed the verify is stored at the block 469; then, the method moves to the block 472. Such point is also reached from the block 466 directly when all the groups of the block satisfy the above-mentioned condition. The method verifies at the block 472 if all of blocks of the sector have been read. In the negative case, the method returns to the block 463 by repeating the same operations on a subsequent block of the sector; on the contrary, the method ends at the block 475.

Figure 5A:
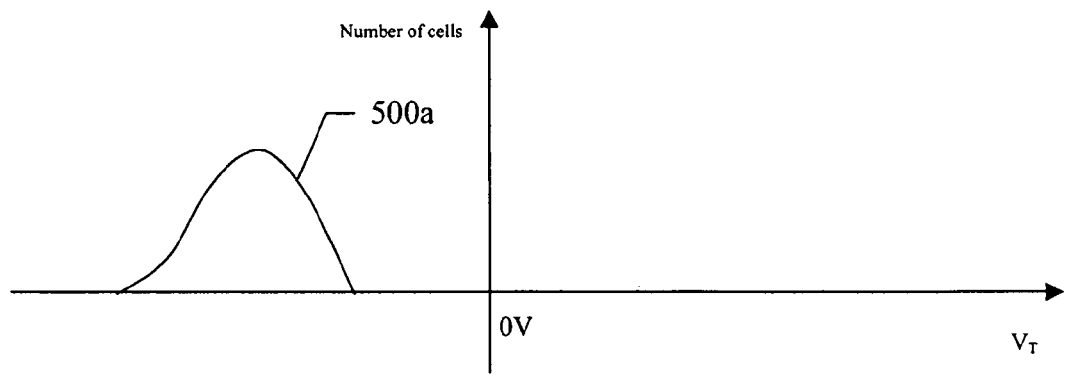

Considering now the FIG. 5a, a schematic representation of a distribution 500a of the threshold voltages of the cells after the erasing phase is shown. The distribution 500a is represented in a diagram having the number of the cells on the axis of ordinates, in logarithmic scale, and the value of the threshold voltage (VT) on the axis of the abscissas. As it can be noted, the threshold voltage of all the cells is lower than the reference reading value (0V); however, the distribution 500a exhibits a tail extending to left, due to the cells having a very negative threshold voltage.

Figure 5B:
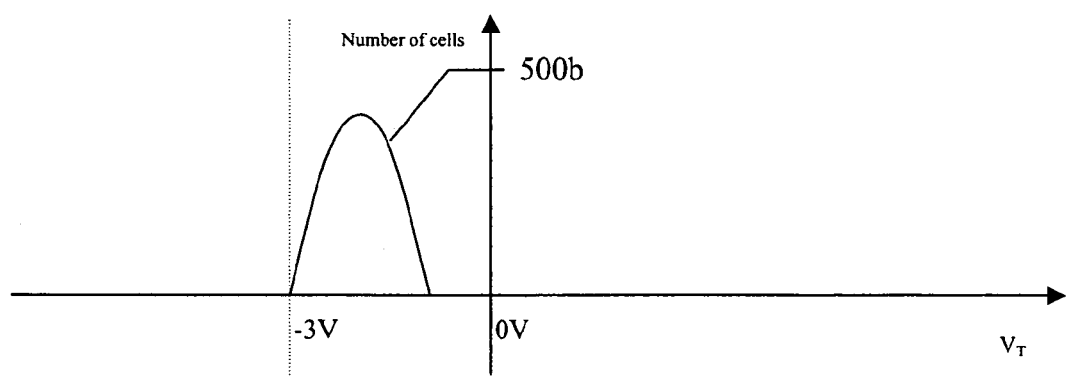

Moving to the FIG. 5b, a distribution 500b of the threshold voltages of the same cells after the compacting phase at the page level is shown. In such case, the threshold voltage of all the cells is brought over the desired limit value (−3V); it should be noted that the distribution 500b is for more compacted with respect to one shown in the preceding figure; in particular, the tail of the distribution due to the cells having a very low threshold voltage is strongly reduced; such result is obtained thanks to the selective programming of the cells having the threshold voltage lower than the limit value. Moreover, is such a way it is possible to know the exact position of the distributions of the threshold voltages of the erased cells (since there is no cell which threshold voltage is lower than the limit value).

Figure 5C:
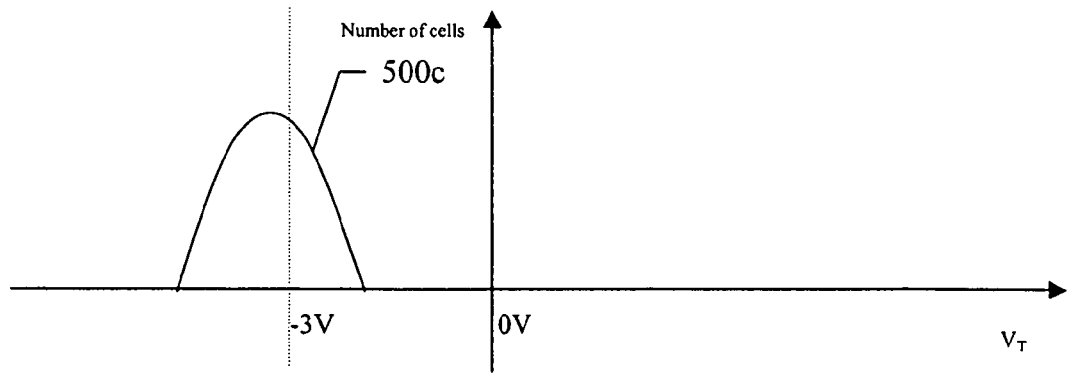

Likewise, in FIG. 5c a distribution 500c of the threshold voltages of the same cells after the compacting phase at the string level is shown. In such case, the threshold voltage of few cells only is brought over the limit value −3V (since the procedure is stopped when a string of each block exceeds such value); however, the distribution 500c results in any case substantially compacted.

Notwithstanding, such choice offers a high processing speed (to the detriment of lower accuracy).

Figure 5D:
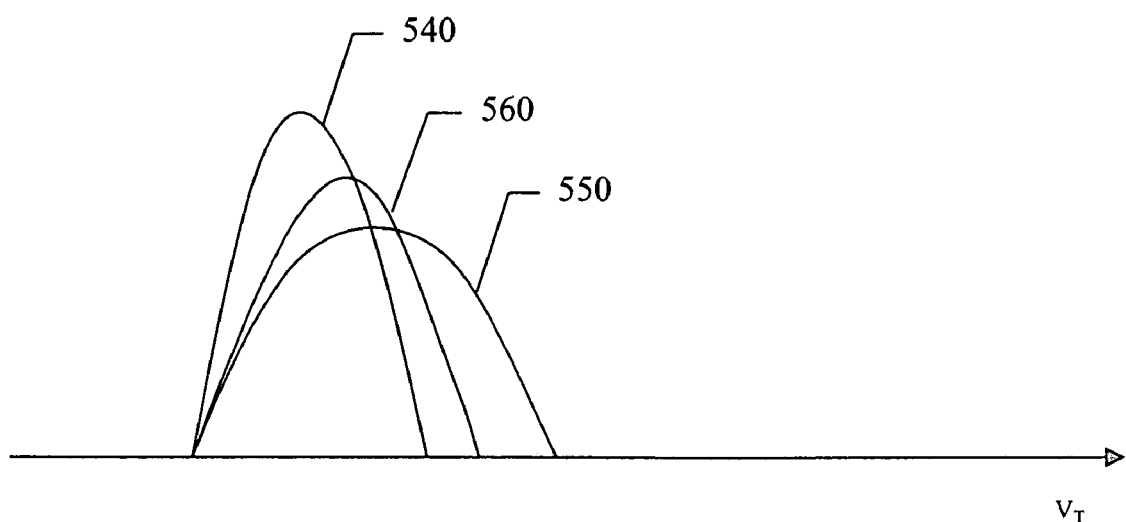

The reduction of the disturb, due to the capacitive coupling among the floating gates of adjacent cells, obtained by means of the above described solution is shown schematically in FIG. 5d. In particular, the figure shows a generic distribution 540 of the threshold voltage of the cells of a page.

When an (erased but not compacted) adjacent page is programmed, the distribution of the threshold voltages spreads (550) due to the high increment of the threshold voltage of the cells of the adjacent page having a starting value very negative. On the contrary, if the adjacent page has been compacted, such effect is much more reduced; thus, the distribution of the threshold voltages spreads less (curve 560).

Naturally, in order to satisfy local and specific requirements, a person skilled in the art may apply to the solution described above many modifications and alterations. Particularly, although the present invention has been described with a certain degree of particularity with reference to preferred embodiments thereof, it should be understood that various omissions, substitutions and changes in the form and details as well as other embodiments are possible; moreover, it is expressly intended that specific elements and/or method steps described in connection with any disclosed embodiment of the invention may be incorporated in any other embodiment as a general matter of design choice.

For example, similar considerations apply if the memory device has a different structure or includes equivalent components. Moreover, the numerical examples are merely indicative, and they have not to be considered in a limitative way; in particular, the reference reading value can be different from 0V as well as the limit value can be different from −3V/−3.5V. Moreover, it should be specified that the programming and/or erasing pulses that are applied to the cells of the sector need not necessarily to have length and width equal to the ones indicated in the preceding description. Likewise, the maximum tolerable number of iterations of each loop described in some phases of the proposed solution can also be different from a phase to the other and it can also results equal to some tens.

It is emphasized that, although for the sake of simplicity of the description reference has been made to a two-level memory, it is evident that the proposed solution is particularly advantageous in a multi-level memory.

Similar considerations apply if the n-type and p-type regions are reversed and consequently voltages of opposite sign are used; for example, it is not excluded the application of the proposed solution to a structure using a negative (i.e., lower or equal than zero) row decoding, whereas suitable biasing positive voltages are applied to the body region for reading the cells with respect to positive values. In any case, the proposed solution can also be applied with a row decoding that manages biasing voltages of both signs.

Moreover, nothing prevents each group to be formed by more cells and/or strings.

Likewise, any other criterion can be used for stopping the restoring; for example, it is not excluded that the restoring is interrupted in response to the reaching of the limit value by a predetermined number of cells of the page or by all the read strings.

In addition, it is possible that the method operates by omitting the initial programming phase.

With regards the erasing phase, alternatively to the erasing pulse proposed in the preceding description, it is not excluded to use of a single blind erasing pulse.

Moreover, an implementation without any erase verify after the compacting is contemplated. In any case, such verify can also be performed with respect to the effective reading reference value (without any margin); alternatively, it is possible to perform the erase verify phase at the level of the whole sector (by biasing all the word lines to the reference reading value).

In addition, it is possible that a general variant of the proposed solution provides three or more iterations of the compacting loop. However, it is not essential to introduce more restoring loops; in fact, in some cases only one loop can be sufficient for the proposed purposes.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

The invention claimed is:

1. A flash memory device with NAND architecture, comprising:
   a matrix of memory cells each having a programmable threshold voltage, wherein the matrix includes at least one sector individually erasable and the matrix is arranged in a plurality of rows and columns with the cells of each row connected to a corresponding word line of a plurality of wordlines and the cells of each column arranged in a plurality of strings of cells connected in series, the strings of each column being connected to a corresponding bit line of a plurality of bit lines;
   means for erasing the cells of a selected sector of the at least one sector; and
   means for restoring the threshold voltages of the erased cells, wherein the means for restoring acts in succession on each of a plurality of blocks of the selected sector, for each one of a set of selected bit lines, each block includes a group of cells connected to a set of selected word lines, the means for restoring including:
      means for reading each group with respect to a first limit value exceeding a reading reference value;
      means for programming only each group in which the threshold voltage of at least one cell of the group does not reach said limit value; and
      means for stopping the restoring in response to reaching the limit value by at least one sub-set of the groups.

2. The memory device according to claim 1, wherein the cells of the selected sector are formed into a common body region, and wherein the means for reading includes means for applying a first biasing voltage corresponding to the reference reading value to each selected word line and means for applying a second biasing voltage corresponding to the limit value to the body region, the first biasing voltage having a value being null or of a first sign and the second biasing voltage having a value being of a second sign.

3. The memory device according to claim 1, wherein each group is formed by a cell, and wherein the means for stopping the restoring are responsive to reaching the limit value by all the cells of the block.

4. The memory device according to claim 1, wherein each group is formed by a string, and wherein the means for stopping the restoring are responsive to reaching the limit value by the cells of a predetermined number of strings of the block.

5. The memory device according to claim 1, further including means for programming the cells of the selected sector before the erasing.

6. The memory device according to claim 1, wherein the means for erasing includes means for applying an erasing pulse to the cells of the selected sector, means for verifying the erasing of the cells of the selected sector after the application of the erasing pulse, and means for incrementing the erasing pulse in response to a negative verify of the erasing after applying the erasing pulse.

7. The memory device according to claim 1, further including means for verifying the erasing of the cells of the sector after the restoring, and further means for erasing the cells of the sector in response to a negative verify of the erasing after the restoring, the further means for erasing including means for applying a further erasing pulse lower than the erasing pulse.

8. The memory device according to claim 7, wherein the cells of the selected sector are formed into a common body region, and wherein the means for reading includes means for applying a first biasing voltage corresponding to the reference reading value to each selected word line and means for applying a second biasing voltage corresponding to the limit value to the body region, the first biasing voltage having a value being null or of a first sign and the second biasing voltage having a value being of a second sign, wherein the means for verifying the erasing includes further means for reading in succession the blocks of the sector with respect to a reference reading value with a margin, the further means for reading including means for applying a further second biasing voltage corresponding to the reference reading value with a margin to the body region, the further second biasing voltage having a value of the second sign.

9. The memory device according to claim 1, further including means for enabling the means for restoring in succession with a plurality of limit values, each limit value other than the first limit value being included between a preceding limit value and the reference reading value.

10. An erasing method for use in a flash memory device with NAND architecture including a matrix of memory cells each having a programmable threshold voltage, wherein the matrix includes at least one individually erasable sector and the matrix is arranged in a plurality of rows and columns with the cells of each row connected to a corresponding word line of a plurality of wordlines and the cells of each column arranged in a plurality of strings of cells connected in series, the strings of each column being connected to a corresponding bit line of a plurality of bitlines, the method comprising:
   erasing the cells of a selected sector of the at least one individually erasable sector; and
   restoring the threshold voltages of the erased cells, wherein the restoring is performed in succession on each of a plurality of blocks of the sector, for each one of a set of selected bit lines each block includes a group of cells connected to a set of selected word lines, for each block the step of restoring including:
      reading each group with respect to a first limit value exceeding a reading reference value;
      programming only each group in which the threshold voltage of at least one cell of the group does not reach said limit value; and
      stopping the restoring in response to the reaching of the limit value by at least one sub-set of the groups.

11. The method of claim 10, wherein the cells of the selected sector are formed into a common body region, and wherein the reading includes applying a first biasing voltage, corresponding to the reference reading value, to each selected word line and applying a second biasing voltage, corresponding to the limit value, to the body region, the first biasing voltage having a value that is null or of a first sign and the second biasing voltage having a value that is of a second sign.

12. The method of claim 10, wherein each group is formed by a cell, and wherein the stopping is performed in response to reaching the limit value by all the cells of the block.

13. The method of claim 10, wherein each group is formed by a string, and wherein the stopping is performed in response to reaching the limit value by the cells of a selected number of strings of the block.

14. The method of claim 10, further including programming the cells of the selected sector before the erasing.

15. The method of claim 10, wherein the erasing includes applying an erasing pulse to the cells of the selected sector, verifying the erasing of the cells of the selected sector after applying the erasing pulse, and incrementing the erasing pulse in response to a negative verify of the erasing after applying the erasing pulse.

16. The method of claim 10, further including:
  verifying the erasing of the cells of the sector after the restoring; and
  applying a further erasing pulse, lower than the erasing pulse, to the cells of the sector in response to a negative verify of the erasing after the restoring.

17. The method of claim 10, further including enabling the restoring step in succession with a plurality of limit values, each limit value other than the first limit value being included between a preceding limit value and the reference reading value.

18. An erasing method for use in a flash memory device with NAND architecture including a matrix of memory cells each having a programmable threshold voltage, wherein the matrix includes plural individually erasable sectors of memory cells and the matrix is arranged in a plurality of rows and columns with the cells of each row connected to a corresponding word line of a plurality of wordlines and the cells of each column arranged in a plurality of strings of cells connected in series, the strings of each column being connected to a corresponding bit line of a plurality of bitlines, each sector including a plurality of blocks of cells, the method comprising:
  erasing the cells of a selected sector of the plurality of individually erasable sectors; and
  for each block of the selected sector:
    determining whether the threshold voltage of any of the cells of the block has reached a first limit value exceeding a reading reference value;
    programming the cells of the block if the threshold voltage of at least one cell of the block does not reach the first limit value; and
    repeating the determining and programming steps until at least one set of the cells of the block has reached the first limit value.

19. The method of claim 18, wherein the cells of the selected sector are formed into a common body region, and wherein the determining step includes applying a first biasing voltage, corresponding to the reference reading value, to each word line of the block and applying a second biasing voltage, corresponding to the first limit value, to the body region, the first biasing voltage having a value that is null or of a first sign and the second biasing voltage having a value that is of a second sign.

20. The method of claim 18, wherein the determining and programming steps are repeated for each block until the threshold voltages of all of the cells of the block have reached the first limit value.

21. The method of claim 18, wherein the determining and programming steps are repeated for each block until the threshold voltages of the cells of a selected number of strings of the block have reached the first limit value.

22. The method of claim 18, further including programming the cells of the selected sector before the erasing.

23. The method of claim 18, wherein the erasing includes applying an erasing pulse to the cells of the selected sector, verifying the erasing of the cells of the selected sector after applying the erasing pulse, and incrementing the erasing pulse in response to a negative verify of the erasing after applying the erasing pulse.

24. The method of claim 18, further including:
  verifying the erasing of the cells of the sector after the restoring; and
  applying a further erasing pulse, lower than the erasing pulse, to the cells of the sector in response to a negative verify of the erasing after the restoring.

25. The method of claim 18, wherein, after performing the determining, programming, and repeating steps for each block of the selected sector, the method includes, for each block of the selected sector:
  determining whether the threshold voltage of any of the cells of the block has reached a second limit value that is between the first limit value and the reading reference value;
  programming the cells of the block if the threshold voltage of at least one cell of the block does not reach the second limit value; and
  repeating the determining and programming steps until at least one set of the cells of the block has reached the second limit value.

* * * * *